(12) United States Patent
Sun et al.

(10) Patent No.: US 12,315,574 B2
(45) Date of Patent: May 27, 2025

(54) AUTO-CALIBRATED CORRECTIVE READ

(71) Applicant: Micron Technology, Inc., Boise, ID (US)

(72) Inventors: Chengbin Sun, Meridian, ID (US); Carmine Miccoli, Boise, ID (US); Violante Moschiano, Avezzano (IT); Srinath Venkatesan, Boise, ID (US); Walter Di Francesco, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 239 days.

(21) Appl. No.: 18/130,589

(22) Filed: Apr. 4, 2023

(65) Prior Publication Data

US 2023/0335200 A1    Oct. 19, 2023

Related U.S. Application Data

(60) Provisional application No. 63/332,399, filed on Apr. 19, 2022.

(51) Int. Cl.
*G11C 7/00* (2006.01)
*G11C 16/08* (2006.01)
*G11C 16/26* (2006.01)
*G11C 16/34* (2006.01)

(52) U.S. Cl.
CPC ............. *G11C 16/26* (2013.01); *G11C 16/08* (2013.01); *G11C 16/3404* (2013.01); *G11C 2207/2254* (2013.01)

(58) Field of Classification Search
CPC ....... G11C 7/1051; G11C 7/22; G11C 7/1072; G11C 7/1006; G11C 7/1066
USPC ....................... 365/189.15, 189.14
See application file for complete search history.

(56) References Cited

U.S. PATENT DOCUMENTS

2013/0318422 A1*  11/2013  Weathers ........... G11C 16/3454
                                                    714/780

* cited by examiner

*Primary Examiner* — Son T Dinh
(74) *Attorney, Agent, or Firm* — Lowenstein Sandler LLP

(57) ABSTRACT

A memory device includes a memory array and control logic, operatively coupled to the memory array, to perform operations including causing a read operation to be initiated with respect to a set of target cells, determining whether the read operation has failed, in response to determining that the read operation has failed, obtaining, for each group of adjacent cells, respective cell state information, assigning, based on the cell state information, each target cell of the set of target cells to a respective state information bin of a set of state information bins, determining whether to initiate auto-calibrated corrective read, in response to determining to initiate auto-calibrated corrective read, performing read level offset calibration to determine a set of calibrated read level offsets, and causing the set of target cells to be read using the set of calibrated read level offsets.

20 Claims, 11 Drawing Sheets

AUTO-CALIBRATED CORRECTIVE READ

RELATED APPLICATION

This application claims the benefit of U.S. Provisional Application 63/332,399, filed on Apr. 19, 2022 and entitled "AUTO-CALIBRATED CORRECTIVE READ", the entire contents of which are incorporated by reference herein.

TECHNICAL FIELD

Embodiments of the disclosure relate generally to memory sub-systems, and more specifically, relate to auto-calibrated corrective read.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
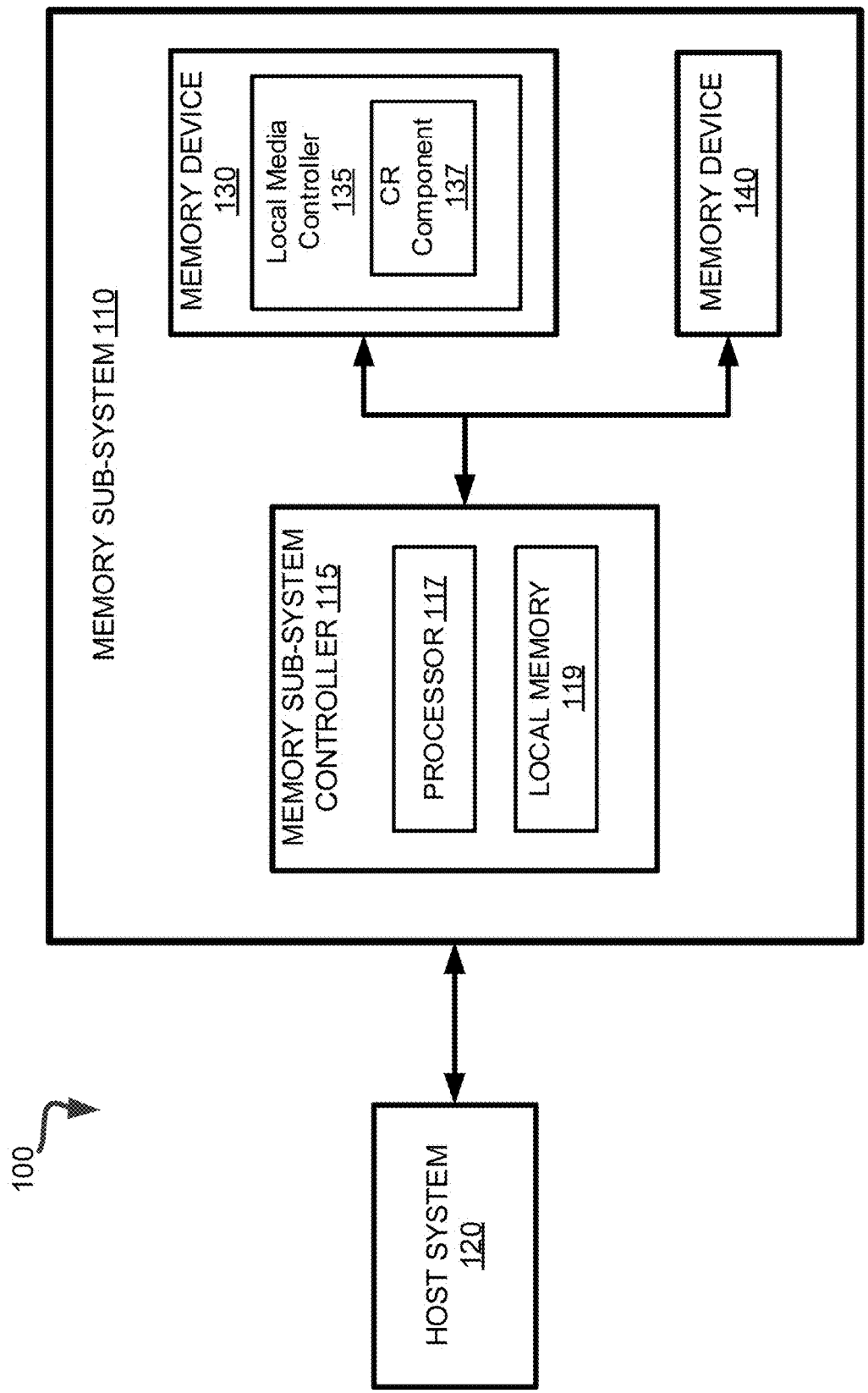
FIG. 1A illustrates an example computing system that includes a memory sub-system, in accordance with some embodiments of the present disclosure.

Aspects of the present disclosure are directed to auto-calibrated corrective read. A memory sub-system can be a storage device, a memory module, or a combination of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1A-1B. A non-volatile memory device is a package of one or more dies. Each die includes one or more planes. For some types of non-volatile memory devices (e.g., NAND devices), each plane includes a set of physical blocks. Each block consists of a set of pages. Each page includes a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device can include multiple memory cells arranged in a two-dimensional or three-dimensional grid. Memory cells are formed onto a silicon wafer in an array of columns and rows. A memory device can further include conductive lines connected to respective ones of the memory cells, referred to as wordlines and bitlines. A wordline can refer to one or more rows of memory cells of the memory device and a bitline can refer to one or more columns of memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

Some memory devices can be three-dimensional (3D) memory devices (e.g., 3D NAND devices). For example, a 3D memory device can include memory cells that are placed between sets of layers including a pillar (e.g., polysilicon pillar), a tunnel oxide layer, a charge trap (CT) layer, and a dielectric (e.g. oxide) layer. A 3D memory device can have a "top deck" corresponding to a first side and a "bottom deck" corresponding to a second side. Without loss of generality, the first side can be a drain side and the second side can be a source side. For example, a 3D memory device can be a 3D replacement gate memory device having a replacement gate structure using wordline stacking.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_T$ (also referred to as the "threshold voltage") such that the source-drain electric current is low for the control gate voltage ($V_{CG}$) being below the threshold voltage, $V_{CG} < V_T$. The current increases substantially once the control gate voltage has exceeded the threshold voltage, $V_{CG} > V_T$. Because the actual geometry of the electrodes and gates varies from cell to cell, the threshold voltages can be different even for cells implemented on the same die. The cells can, therefore, be characterized by a distribution P of the threshold voltages, P $(Q, V_T) = dW/dV_T$, where dW represents the probability that any given cell has its threshold voltage within the interval $[V_T, V_T + dV_T]$ when charge Q is placed on the cell.

A memory device can exhibit threshold voltage distributions P $(Q, V_T)$ that are narrow compared with the working range of control voltages tolerated by the cells of the device. Accordingly, multiple non-overlapping distributions P $(Q_k, V_T)$ ("valleys") can be fit into the working range allowing for storage and reliable detection of multiple values of the charge $Q_k$, k=1, 2, 3 . . . . The distributions (valleys) are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

A valley margin can also be referred to as a read window. For example, in a SLC cell, there is 1 read window that exists with respect to the 2 $V_t$ distributions. As another example, in an MLC cell, there are 3 read windows that exist with respect to the 4 $V_t$ distributions. As yet another example, in a TLC cell, there are 7 read windows that exist with respect to the 8 $V_t$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) refers to the cumulative value of the read windows.

Cells of a memory array that are selected to be read during a read operation can be referred to target cells connected to a target wordline. The target cells can neighbor adjacent cells connected to at least one wordline neighboring the target wordline ("adjacent wordline"). For example, the at least one adjacent wordline can be a single wordline neighboring the target wordline or a pair of wordlines neighboring the target wordline. Illustratively, the target wordline can be referred to as an n-th wordline ($WL_n$), and the at least one adjacent wordline can include at least one of adjacent wordline n−1 ($WL_{n-1}$) or adjacent wordline n+1 ($WL_{n+1}$). For example, in a 3D memory device, the set of adjacent wordlines can include a wordline located directly above the target wordline and/or a wordline located directly below the target wordline.

Each target cell has a respective group of adjacent cells. Each group of adjacent cells includes at least one cell that neighbors its respective target cell (e.g., one cell connected to $WL_{n-1}$ and/or one cell connected to $WL_{n+1}$). More specifically, each target cell can be connected to the same bitline as each cell of the respective group of adjacent cells, such that the target cell and the cells of the respective group of adjacent cells are within the same string. Accordingly, each group of adjacent cells can include a single adjacent cell, or a pair of adjacent cells connected to a same bitline as a respective target cell.

A read can include a prologue phase during which a controller activates voltage pumps (e.g., causes voltage pumps to be turned on) and loads information for the read operation, a strobe phase in which a number of strobes are performed, and an epilogue phase during which the controller causes the cells to discharge, deactivates the voltage pumps (e.g., causes the voltage pumps to be turned off) and causes the memory device to return to an idle or standby state (e.g., depending on the state of the CE #signal). A strobe refers to a read performed at a particular read level offset (e.g., by applying the read level offset to a base read level). For example, for a 3 strobe page type, a 3 strobe read can be performed during the strobe phase.

Read level calibration is one mechanism that can be used by a controller to identify a calibrated read level for reading target cells connected to a target wordline. Read level calibration can be performed by analyzing $V_T$ distributions of a group of cells to obtain a model (e.g., histogram) describing the $V_T$ distributions, and identifying the calibrated read level from the model. For example, read level calibration can be performed by identifying a set of sample voltages about a chosen read level. Then, for each sample voltage of the set of sample voltages, the number of cells of the group that have a $V_T$ lower than the sample voltage is counted (e.g., in ascending order of voltages). The model (e.g., histogram) can be created using the cell counts (e.g., a histogram model), and the calibrated read level can be identified as the lowest or deepest point of the model. The calibrated read level identified using read level calibration can then be used to read the group of cells.

Illustratively, assume that read level calibration is being performed around a valley with respect to a particular $V_T$. The set of sample voltages can be defined within a voltage interval. A first cell count can be obtained by counting the number of cells of the group that have a $V_T$ lower than a first voltage within the voltage interval, a second cell count can be obtained by counting the number of cells of the group that have a $V_T$ lower than a second voltage within the voltage interval, . . . , and an n-th cell count can be obtained by counting the number of cells of the group that have a $V_T$ lower than an n-th voltage within the voltage interval. The valley can be modeled as a histogram created based on the n cell counts. If the cell counts with respect to and i-th and j-th voltage within the interval are determined to be the lowest, then the calibrated read voltage can be identified somewhere between the i-th and j-th voltage.

Cell-to-cell interference may exist in a memory array between the target cells and their respective groups of adjacent cells. Cell-to-cell interference can lead to lateral charge migration and $V_t$ distribution shift. Cell-to-cell interference, in addition to intrinsic charge loss, can further lead to a widening of $V_T$ distributions. The $V_T$ distribution widening can cause RWB degradation, which can negatively affect memory device reliability. For example, RWB degradation can lead to an increase in the number of errors (e.g., bit errors) and/or error rate (e.g., bit error rate (BER)).

One mechanism to compensate for the effects of cell-to-cell interference and/or intrinsic charge loss is corrective read. Generally, a corrective read operation is performed to read each target cell using an appropriate read level offset that accounts for the cell-to-cell inference, lateral charge migration and/or intrinsic charge loss caused by the respective group of adjacent cells. The read level offset can be applied with respect to a center read level. For example, the center read level can be located within a valley between target cell $V_T$ distributions.

To implement a corrective read operation, a controller can, for each group of adjacent cells, obtain cell state information for each cell of the group of adjacent cells. The cell state information for a cell reflects the logical level (e.g., L0-Ln, where n is the total number of logical levels supported) of the cell. For example, if a cell is an SLC cell, the cell state information can reflect whether the cell is in the L0 state or the L1 state. As another example, if the cell is a TLC cell, the cell state information can reflect which of the states L0-L7 that the cell is in. The cell state information for a cell can be obtained by identifying the state of the cell.

To identify the state of the cell, the controller can cause a read voltage to be applied the cell (e.g., gate electrode of the cell) and determine whether the read voltage activates (e.g., turns on) the cell. If the read voltage activates the cell, this indicates that the read voltage is greater than or equal to the $V_T$ of the cell. Additional read voltage(s) may be applied to the cell to determine whether the cell is in a lower state. If the read voltage does not activate the cell, this means that the read voltage is less than the $V_T$ of the cell, and that the cell is in a higher state. Additional read voltage(s) may be applied until the cell is activated. For each group of adjacent cells, the controller can store the cell state information for each cell of the group of adjacent cells in a respective page buffer (e.g., static page buffer). Each page buffer can be connected to a respective group of adjacent cells via a bitline.

In some embodiments, the cell state information for each cell of a group of adjacent cells is 1-bit information. For example, obtaining the 1-bit cell state information can involve applying a single strobe read to each cell of the group of adjacent cells. If the group of adjacent cells includes a single cell (e.g., a cell connected to one of the adjacent wordlines $WL_{n-1}$ and $WL_{n+1}$), then the stored cell state information is 1 bit in total. The 1-bit stored cell state information can be used to implement 1-bit corrective read (1BCR). If the group of adjacent cells includes a pair of cells (e.g., cells connected to the adjacent wordlines $WL_{n-1}$ and $WL_{n+1}$), then the stored cell state information is 2 bits in total. The 2 bit stored cell state information can be used to implement a "1-bit 2-sided" version of 2-bit corrective read (2BCR).

In some embodiments, the cell state information for each cell of a group of adjacent cells is 2-bit information. For example, obtaining the 2-bit cell state information can involve applying a three strobe read to each cell of the group of adjacent cells. If the group of adjacent cells includes a single adjacent cell (e.g., a cell connected to one of the adjacent wordlines $WL_{n-1}$ and $WL_{n+1}$), then the stored cell state information is 2 bits in total. The 2 bit stored cell state information can be used to implement a "2-bit 1-sided" version of 2BCR. If the group of adjacent cells includes a pair of cells (e.g., cells connected to the adjacent wordlines $WL_{n-1}$ and $WL_{n+1}$), then the stored cell state information is 4 bits in total. The 4 bit stored cell state information can be used to implement 4-bit corrective read (4BCR).

The controller can then assign each target cell to a respective state information bin ("bin") using the cell state information for each cell of the respective group of adjacent cells. As will be described in further detail below, each bin defines a respective cell state information condition, and a target cell is assigned to a bin if the cell(s) within its respective group of adjacent cells satisfy the cell state information condition for the bin. Thus, the bins divide each target cell $V_T$ distribution into a number of respective target cell $V_T$ sub-distributions, where each target cell $V_T$ sub-distribution is formed from the target cells assigned to a respective bin.

For example, assume that a group of adjacent cells for a target cell connected to $WL_n$ is a single adjacent cell connected to $WL_{n-1}$ or $WL_{n+1}$. The cell state information condition for a bin can define a range of states for single adjacent cells. A target cell can then be assigned to the bin if the cell state information for the single adjacent cell indicates that the state of the single adjacent cell falls within the range.

As another example, assume that a group of adjacent cells for a target cell connected to $WL_n$ is a pair of adjacent cells including a first adjacent cell connected to $WL_{n-1}$ and a second adjacent cell connected to $WL_{n+1}$. The cell state information condition for a bin can define a first range of states for first adjacent cells and a second range of states for second adjacent cells. The target cell can then be assigned to the bin if the cell state information for the first adjacent cell indicates that the state of the first adjacent cell falls within the first range and if the cell state information for the second adjacent cell indicates that that the state of the second adjacent cell falls within the second range.

The number of bins can be determined by the particular corrective read implementation (e.g., 1BCR, 2BCR or 4BCR). More specifically, the number of bins can be determined as $2^B$, where B equals the total number of bits of cell state information stored for a group of adjacent cells.

For example, in a 1BCR implementation in which B=1, the number of bins is 2 (i.e., $2^1$) and each bin defines a respective cell state information condition. Illustratively, for a QLC cell implementation in which there are 16 total possible states L0-L15, a target cell can be assigned to a first bin assigned with a first read level offset if its single adjacent cell is determined to have a state from L0-L7, and a target cell can be assigned to a second bin assigned with a second read level offset if its single adjacent cell is determined to have a state from L8-L15.

As another example, in a 2-bit 1-sided 2BCR implementation in which B=2, the number of bins is 4 (i.e., $2^2$) and each bin defines a respective cell state information condition. Illustratively, for the QLC cell implementation, a target cell can be assigned to a first bin assigned with a first read level offset if its single adjacent cell is determined to have a state from L0-L3, a target cell can be assigned to a second bin if its single adjacent cell is determined to have a state from L4-, a target cell can be assigned to a third bin if its single adjacent cell is determined to have a state from L8-L11, and a target cell can be assigned to a fourth bin if its single adjacent cell is determined to have a state from L12-L15.

As yet another example, in a 1-bit 2-sided 2BCR implementation in which B=2, the number of bins is 4 (i.e., $2^2$) and each bin defines a respective cell state information condition. Illustratively, for the QLC cell implementation, a target cell can be assigned to a first bin if the adjacent cell connected to adjacent wordline $WL_{n-1}$ and the adjacent cell connected to adjacent wordline $WL_{n+1}$ are each determined to have a state from L0-L7. A target cell can be assigned to a second bin if the adjacent cell connected to adjacent wordline $WL_{n-1}$ is determined to have a state from L0-L7 and the adjacent cell connected to adjacent wordline $WL_{n+1}$ is determined to have a state from L8-L15. A target cell can be assigned to a third bin if the adjacent cell connected to adjacent wordline $WL_{n-1}$ is determined to have a state from L8-L15 and the adjacent cell connected to adjacent wordline $WL_{n+1}$ is determined to have a state from L0-L7. A target cell can be assigned to a fourth bin if the adjacent cell connected to adjacent wordline $WL_{n-1}$ and the adjacent cell connected to adjacent wordline $WL_{n+1}$ are each determined to have a state from L8-L15.

As yet another example, in a 4BCR implementation in which B=4, the number of bins is 16 (i.e., $2^4$) and each bin defines a respective cell state information condition. Illustratively, for the QLC cell implementation, a target cell can be assigned to a first bin if the adjacent cell connected to adjacent wordline $WL_{n-1}$ and the adjacent cell connected to adjacent wordline $WL_{n+1}$ each have a state from L0-L3. A target cell can be assigned to a second bin if the adjacent cell connected to adjacent wordline $WL_{n-1}$ is determined to have a state from L0-L3 and the adjacent cell connected to adjacent wordline $WL_{n+1}$ is determined to have a state from L4-L7. A target cell can be assigned to a third bin if the adjacent cell connected to adjacent wordline $WL_{n-1}$ is determined to have a state L0-L3 and the adjacent cell connected to adjacent wordline $WL_{n+1}$ is determined to have a state from L8-L11. A target cell can be assigned to a fourth bin if the adjacent cell connected to adjacent wordline $WL_{n-1}$ is determined to have a state from L0-L3 and the adjacent cell connected to adjacent wordline $WL_{n+1}$ is determined to have a state from L12-L15. The remaining 1two bins can be generated with other similar combinations of states.

Each bin is assigned a respective read level offset for reading the target cells assigned to the bin. Each read level offset accounts for the effect that the state of each cell of the group of adjacent cells has on the respective target cell. Typically, the read level offset assigned to a bin is empirically determined through observation or experimentation of the effect that adjacent cell(s) with varying states have on respective target cells. The bin assignments and corresponding read level offsets can be stored in a metadata area of the device. Accordingly, the bins and read level offset assignments can be pre-determined before assigning target cells to bins.

The controller can then cause the target cells to be read using respective read level offsets. For example, the controller can cause target cells of a first bin, which form a first target cell $V_T$ sub-distribution, to be read at a first read level. The first read level is determined by locating a center read level, and applying the read level offset assigned to the first bin to the center read level. The center read level can have a voltage magnitude located within the valley between a pair of target cell $V_T$ distributions, and the read level offset can adjust the center read level such that the first read level can have a voltage magnitude located in the valley to the left of the first target cell $V_T$ sub-distribution. The other target cells can be read similarly.

In some implementations, corrective read as described above can be performed using a set of fixed read level offsets. For example, each bin can be assigned a respective read level offset that is provided by a user. However, such read level offsets can eventually cause read failures over time due to the effects of cell-to-cell interference and lateral charge migration.

Aspects of the present disclosure address the above and other deficiencies by implementing auto-calibrated corrective read. The auto-calibrated corrective read process described herein can be used to obtain a set of auto-calibrated read level offsets for reading target cells. For example, after obtaining the cell state information with respect to each group of adjacent cells, each auto-calibrated read level offset of the set of auto-calibrated read level offsets can be obtained by performing read level calibration on a respective pair of $V_T$ sub-distributions. Each $V_T$ sub-distribution is defined by the target cells assigned to a respective bin. Although applying the set of auto-calibrated read level offsets typically results in a more accurate read of target cells than both the read level offsets used during a non-corrective read operation and the set of fixed read level offsets used during typical corrective read, the process of obtaining the set of auto-calibrated read level offsets generally consumes more time and resources as compared to those other mechanisms. Thus, embodiments described herein can implement auto-calibrated corrective read when other read mechanisms have failed.

For example, a controller can initiate a non-corrective read. To perform the non-corrective read, the controller can perform a read operation using a calibrated read level identified using read level calibration with respect to the $V_T$ distributions defined by the set of target cells. The controller can then determine whether the non-corrective read has failed. For example, the controller can determine whether a number of read errors satisfies a threshold condition (e.g., the number of read errors exceeds a threshold number of read errors). If the non-corrective read has succeeded, the process ends.

If the non-corrective read has failed, the controller can perform a corrective read, which can take into account the effects of cell-to-cell interference and/or lateral charge migration on the set of target cells. For example, the controller can, for each group of adjacent cells, obtain cell state information for each cell of the group of adjacent cells. The cell state information can be stored in respective page buffers. In some embodiments, the cell state information is 1-bit information. For example, 1-bit information can be a logical "0" indicative of at least one adjacent cell of the pair of adjacent cells having a programmed state. As another example, the 1-bit information can be a logical "1" indicative of both of the adjacent cells having an erased state. In some embodiments, the cell state information is 2-bit information. For example, the 2-bit information can be a logical "00" indicative of both of the adjacent cells having a programmed state. As another example, the 2-bit information can be a logical "01" or "10" indicative of one of the adjacent cells having a programmed state and the other of the adjacent cells having an erased state. As yet another example, the 2-bit information can be a logical "11" indicative of both of the adjacent cells having an erased state. In some embodiments, the cell state information is 4-bit information. For example, the 4-bit information can be indicative of an electron state for the pair of adjacent cells.

After obtaining the cell state information, the controller can decide whether to first attempt corrective read without read level offset calibration, or to perform corrective read with read level offset calibration (i.e., auto-calibrated corrective read). For example, the controller can determine whether auto-calibrated corrective read skip is enabled (e.g., by determining whether a bit enabling the auto-calibrated corrective read skip is set).

If the controller decides to initiate corrective read without read level offset calibration using the cell state information, as described above (i.e., assigning each target cell to a respective bin, and reading the target cells using the current set of read level offsets each defined by a respective bin). The controller can then determine whether the corrective read without read level offset calibration has failed. For example, the controller can determine whether the number of errors satisfies a threshold condition (e.g., the number of errors is greater than a threshold number of errors). If the corrective read without read level offset calibration has succeeded, the process ends.

If the corrective read without read level offset calibration has failed, or if the controller had instead decided to attempt corrective read with read level offset calibration (e.g., auto-calibrated corrective read skip was determined to be enabled), then the controller can initiate auto-calibrated corrective read. During auto-calibrated corrective read, the controller can, for each bin of target cells, find an auto-calibrated read level offset for reading the target cells assigned to the bin. For example, the controller can use read level calibration (as described above) to separately identify, for each of the $V_T$ sub-distributions defined by the target cells assigned to the respective bin, an auto-calibrated read level offset of the set of auto-calibrated read level offsets. The controller can then update the previous set of read level offsets with the set of auto-calibrated read level offsets, and read the target cells using respective one of the auto-calibrated read level offsets. Accordingly, by performing auto-calibrated corrective read, the set of read level offsets used to read the set of target cells can be identified on-the-fly, as opposed to being predetermined (e.g., empirically derived based on experimentation).

The controller can then determine whether the auto-calibrated corrective read has failed. For example, the controller can determine whether the data read from the memory fails to match an expected value. If the auto-calibrated corrective read has succeeded, the process ends. If the auto-calibrated corrective read has failed, the controller can then initiate at least one error correction technique in an attempt to salvage the data. For example, the controller can utilize error correction code (ECC) stored in ECC memory in the memory sub-system to detect and correct data corruption within the data. Further details regarding implementing auto-calibrated corrective read are described herein below with reference to FIGS. 1-7.

Advantages of the present disclosure include, but are not limited to, improved memory device performance and reliability. For example, calibrating read level offsets during corrective read can improve read accuracy, which reduces read errors and increases the life of a memory device.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The local media controller 135 can initiate a read operation with respect to a set of target cells connected to a target wordline. For example, the local media controller 135 can initiate the read operation in response to receiving a request (e.g., read command) via the memory sub-system controller 115 to read the set of target cells. If the read operation succeeds, then there is no need to perform corrective read.

If the read operation fails, then the local media controller 135 can implement a corrective read (CR) component 137 to initiate a corrective read operation. To do so, the CR component 137 can obtain, for each target cell, cell state information for from each cell of a respective group of adjacent cells. In some embodiments, each group of adjacent cells includes a single cell. In some embodiments, each group of adjacent cells includes a pair of cells. For example, if the memory device 130 is a 3D memory device, the group of adjacent cells can include a cell directly located above its target cell and/or a cell located directly below its target cell. Each cell of the group of adjacent cells is connected to a respective wordline of a group of adjacent wordlines neighboring the target wordline. For example, if the memory device 130 is a 3D memory device, the group of adjacent wordlines can include a wordline located directly above the target wordline and/or a wordline located directly below the target wordline. The cell state information for each pair of adjacent cells can be stored in a respective page buffer. In some embodiments, the cell state information for a cell of a group of adjacent cells is a $V_T$ indicative of a state of the cell.

In some embodiments, the cell state information for each cell of the group of adjacent cells includes 1-bit cell state information. In some embodiments, the cell state information for each cell of the group of adjacent cells includes 2-bit cell state information. The cell state information for each group of adjacent cells can be stored in a respective page buffer. Each page buffer can be connected to its respective group of adjacent cells and respective target cell via a respective bitline. In some embodiments, the cell state information for a cell of a group of adjacent cells is a $V_T$ indicative of a state of the cell.

After obtaining the cell state information, the CR component 137 can determine whether auto-calibrated corrective read (ACCR) skip is enabled. In some embodiments, determining whether ACCR skip is enabled includes determining whether an ACCR skip bit is set. If the CR component 137 determines that ACCR skip is disabled, this means that the CR component 137 will attempt to perform corrective read without read level offset calibration read level offset calibration.

To perform corrective read without read level offset calibration, the CR component 137 can then assign each target cell to a respective state information bin ("bin") based on the cell state information. Each bin defines a respective cell state information condition, and a target cell is assigned to a bin if the cell(s) within its respective group of adjacent cells satisfy the cell state information condition for the bin. Thus, the bins divide each target cell $V_T$ distribution into a number of respective target cell $V_T$ sub-distributions, where each target cell $V_T$ sub-distribution is formed from the target cells assigned to a respective bin.

In some embodiments, the cell state information for each group of adjacent cells includes 1-bit information (e.g., the group of adjacent cells includes a single cell having associated 1-bit information) and the set of bins includes two bins. In some embodiments, the cell state information includes 2-bit information (e.g., the group of adjacent cells includes a single cell having associated 2-bit information, or the group of adjacent cells includes a pair of cells each having associated 1-bit information) and the set of bins includes four bins. In some embodiments, the cell state information includes 4-bit information (e.g., the group of adjacent cells includes a pair of cells each having associated 2-bit information) and the set of bins includes sixteen bins.

For example, in the 1-bit information embodiments, a target cell can be assigned to a programmed state bin if the target cell is connected to a page buffer storing 1-bit information indicating that the target cell is adjacent to a group of adjacent cells in which at least one cell has a programmed state (e.g., logical "0"). In contrast, a target cell can be assigned to an erased state bin if the target cell is connected to a page buffer storing 1-bit information indicating that the target cell is adjacent to a group of adjacent cells in which each adjacent cell has an erased state (e.g., logical "1").

During corrective read without read level offset calibration, each bin is associated with a previously defined read level offset that is used to read the target cells of the bin. In some embodiments, each previously defined read level offset is a predefined read level offset. For example, each predefined read level offset can be a fixed read level offset provided by a user. In some embodiments, each previously defined read level offset is an auto-calibrated read level offset identified from a previous execution of ACCR. The previously defined read level offsets collectively form a set of previously defined read level offsets.

The CR component 137 can cause the target cells of each bin to be read with a respective previously defined read level offset of the set of previously defined read level offsets. The CR component 137 can then determine whether the corrective read without read level offset calibration has failed. If the corrective read without read level offset calibration has succeeded, this means that the read is complete, and the process ends.

If the CR component 137 determines that the corrective read without read level offset calibration has failed, or determines that ACCR skip was enabled, the CR component 137 can initiate ACCR. During ACCR, similar to corrective read without read level offset calibration, the processing device can, using the cell state information, divide the set of target cells into respective bins. In contrast to corrective read without read level offset calibration, during ACCR, each bin is associated with an auto-calibrated read level offset that is used to read the target cells of the bin. The auto-calibrated read level offsets collectively form a set of auto-calibrated read level offsets.

To perform ACCR, the CR component 137 can cause, for each bin of target cells, an auto-calibrated read level offset to be identified. The auto-calibrated read level offsets collectively form a set of auto-calibrated read level offsets. In some embodiments, identifying the set of auto-calibrated read level offsets comprises performing read level offset calibration to identify each auto-calibrated read level offset. For example, the target cells of each bin can define a pair of $V_T$ sub-distributions of target cells, where each pair of $V_T$ sub-distributions of target cells models the $V_T$ distribution for the target cells of the bin. Each auto-calibrated read level offset of the set of read level offsets can be located within a valley between a respective pair of $V_T$ sub-distributions by separately analyzing the pair of $V_T$ sub-distributions using read level offset calibration. For example, in the 1-bit information embodiments, a pair of $V_T$ sub-distributions can be identified for the programmed state bin, and another pair of $V_T$ sub-distributions can be identified for the erased state bin.

The CR component 137 can then update a set of read settings to include the set of auto-calibrated read level offsets. In some embodiments, the set of auto-calibrated read level offsets replaces (e.g., overwrites) the previous set of read level offsets. After updating the set of read settings, the CR component 137 can then cause each target cell to be read using a respective auto-calibrated read level offset of the set of auto-calibrated read level offsets. Since the read level offsets used to read the target cells are calibrated on-the-fly, as opposed to being predetermined, the read operation performed using the set of auto-calibrated read level offsets can lead to reduced error rates and improved memory device performance.

If ACCR has succeeded, this means that the read is complete, and the process ends. If ACCR has failed, this means that ACCR has resulted in a number of read errors. The CR component 137 can then initiate further error correction to address the read errors. Further details regarding the operations of the CR component 137 will be described below with reference to FIGS. 4-6.

Figure 1B:
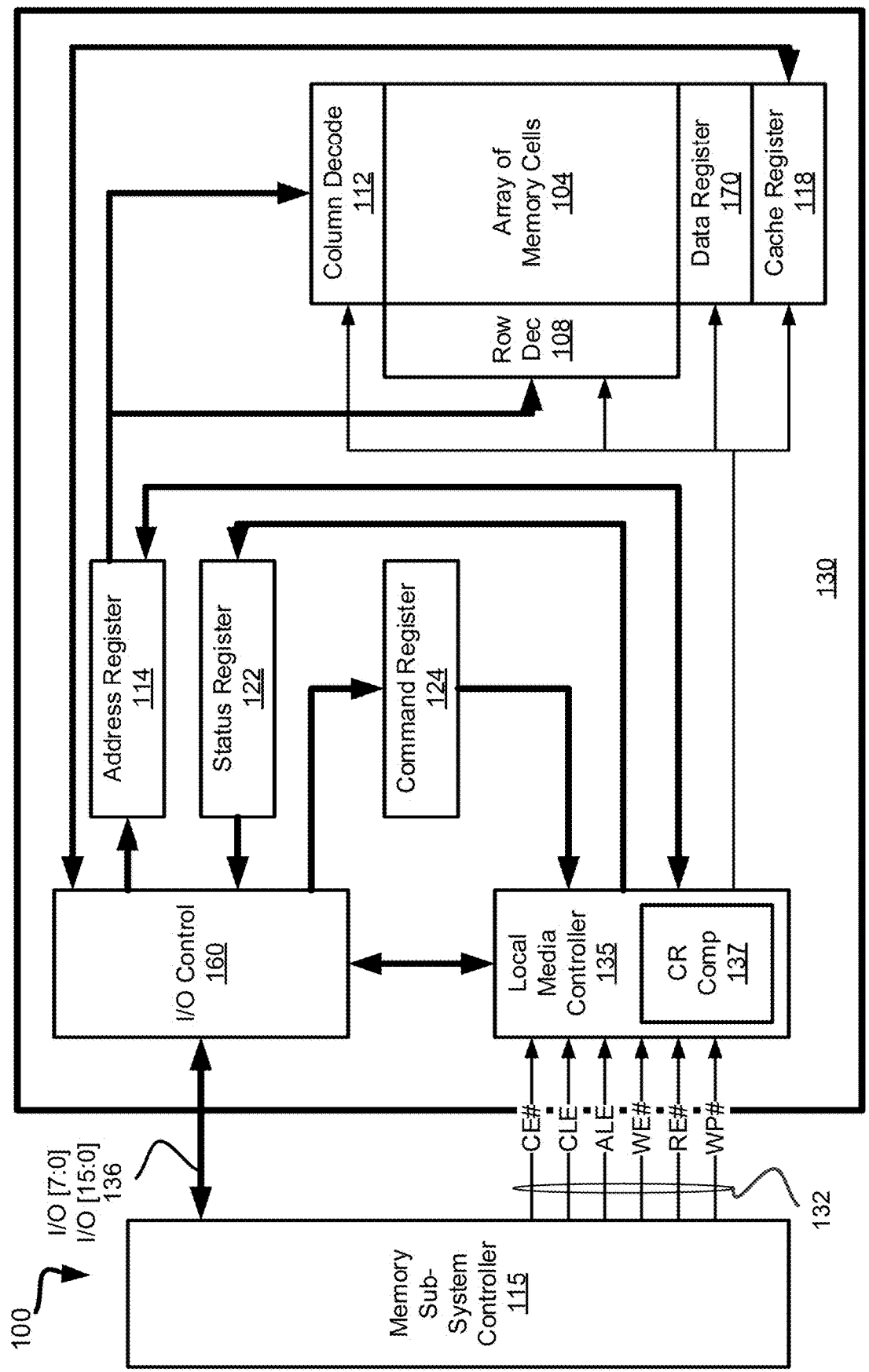
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are connected to the same access line (e.g., a wordline) while memory cells of a logical column are selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 112 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 112 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 112 to control the row decode circuitry 108 and column decode circuitry 112 in response to the addresses. In one embodiment, local media controller 135 includes the CR component 137, which can implement the defect detection described herein during an erase operation on memory device 130.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a program operation (e.g., write operation), data may be passed from the cache register 118 to the data register 170 for transfer to the array of memory cells 104; then new data may be latched in the cache register 118 from the I/O control circuitry 160. During a read operation, data may be passed from the cache register 118 to the I/O control circuitry 160 for output to the memory sub-system controller 115; then new data may be passed from the data register 170 to the cache register 118. The cache register 118 and/or the data register 170 may form (e.g., may form a portion of) a page buffer of the memory device 130. A page buffer may further include sensing devices (not shown in FIG. 1B) to sense a data state of a memory cell of the array of memory cells 204, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 160 and may then be written into command register 124. The addresses may be received over input/output (I/O) pins [7:0] of I/O bus 136 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 118. The data may be subsequently written into data register 170 for programming the array of memory cells 104.

In an embodiment, cache register 118 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS. 1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

Figure 2A:
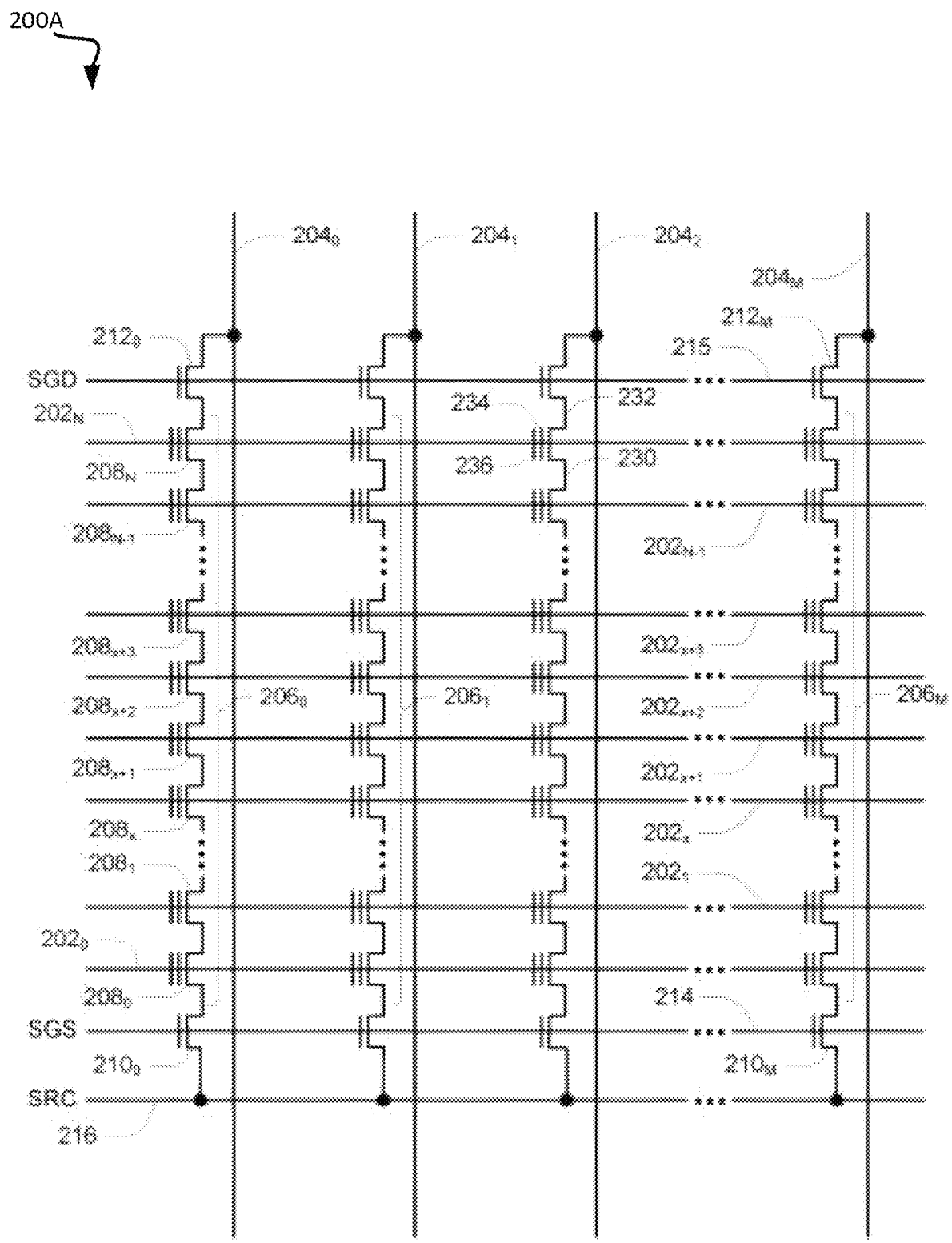
FIGS. 2A-2C are diagrams of portions of an example array of memory cells included in a memory device, in accordance with some embodiments of the present disclosure.
Figure 2B:
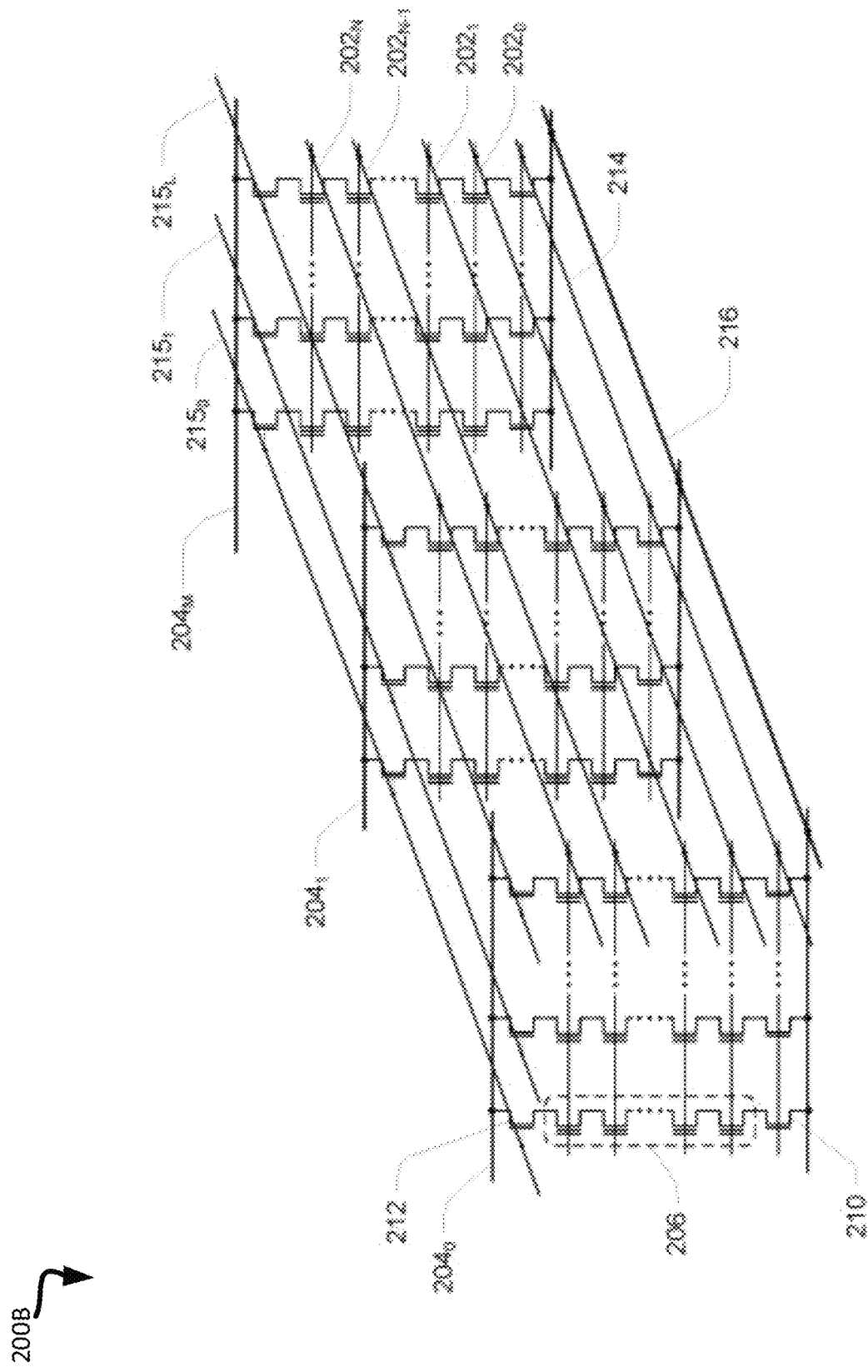
Figure 2C:
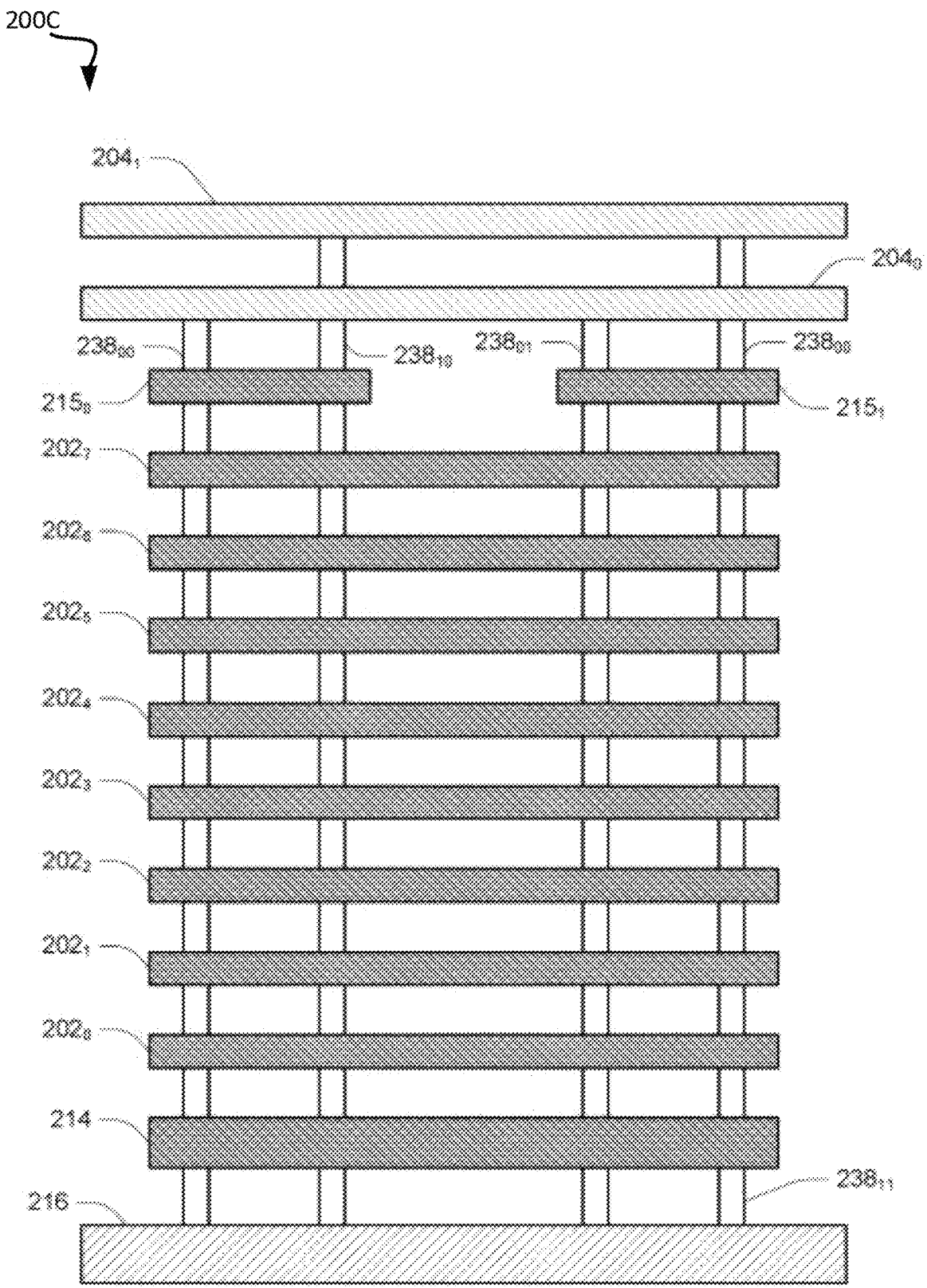

FIGS. 2A-2C are diagrams of portions of an example array of memory cells included in a memory device, in accordance with some embodiments of the present disclosure. For example, FIG. 2A is a schematic of a portion of an array of memory cells 200A as could be used in a memory device (e.g., as a portion of array of memory cells 104). Memory array 200A includes access lines, such as wordlines $202_0$ to $202_N$, and a data line, such as bitline 204. The wordlines 202 may be connected to global access lines (e.g., global wordlines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A can be arranged in rows each corresponding to a respective wordline 202 and columns each corresponding to a respective bitline 204. Rows of memory cells 208 can be divided into one or more groups of physical pages of memory cells 208, and physical pages of memory cells 208 can include every other memory cell 208 commonly connected to a given wordline 202. For example, memory cells 208 commonly connected to wordline $202_N$ and selectively connected to even bitlines 204 (e.g., bitlines $204_0$, $204_2$, $204_4$, etc.) may be one physical page of memory cells 208 (e.g., even memory cells) while memory cells 208 commonly connected to wordline $202_N$ and selectively connected to odd bitlines 204 (e.g., bitlines $204_1$, $204_3$, $204_5$, etc.) may be another physical page of memory cells 208 (e.g., odd memory cells). Although bitlines $204_3$-$204_5$ are not explicitly depicted in FIG. 2A, it is apparent from the figure that the bitlines 204 of the array of memory cells 200A may be numbered consecutively from bitline $204_0$ to bitline $204_M$. Other groupings of memory cells 208 commonly connected to a given wordline 202 may also define a physical page of memory cells 208. For certain memory devices, all memory cells commonly connected to a given wordline might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to wordlines $202_0$-$202_N$ (e.g., all strings 206 sharing common wordlines 202). Unless expressly distinguished, a reference to a page of memory cells herein refers to the memory cells of a logical page of memory cells.

Each column can include a string of series-connected memory cells (e.g., non-volatile memory cells), such as one of strings $206_0$ to $206_M$. Each string 206 can be connected (e.g., selectively connected) to a source line 216 (SRC) and can include memory cells $208_0$ to $208_N$. The memory cells 208 of each string 206 can be connected in series between a select gate 210, such as one of the select gates $210_0$ to $210_M$, and a select gate 212, such as one of the select gates $212_0$ to $212_M$. In some embodiments, the select gates $210_0$ to $210_M$ are source-side select gates (SGS) and the select gates $212_0$ to $212_M$ are drain-side select gates. Select gates $210_0$ to $210_M$ can be connected to a select line 214 (e.g., source-side select line) and select gates $212_0$ to $212_M$ can be connected to a select line 215 (e.g., drain-side select line). The select gates 210 and 212 might represent a plurality of select gates connected in series, with each select gate in series configured to receive a same or independent control signal. A source of each select gate 210 can be connected to SRC 216, and a drain of each select gate 210 can be connected to a memory cell $208_0$ of the corresponding string 206. Therefore, each select gate 210 can be configured to selectively connect a corresponding string 206 to SRC 216. A control gate of each select gate 210 can be connected to select line 214. The drain of each select gate 212 can be connected to the bitline 204 for the corresponding string 206. The source of each select gate 212 can be connected to a memory cell $208_N$ of the corresponding string 206. Therefore, each select gate 212 might be configured to selectively connect a corresponding string 206 to the bitline 204. A control gate of each select gate 212 can be connected to select line 215.

In some embodiments, and as will be described in further detail below with reference to FIG. 2B, the memory array in FIG. 2A is a three-dimensional memory array, in which the strings 206 extend substantially perpendicular to a plane containing SRC 216 and to a plane containing a plurality of bitlines 204 that can be substantially parallel to the plane containing SRC 216.

FIG. 2B is another schematic of a portion of an array of memory cells 200B (e.g., a portion of the array of memory cells 104) arranged in a three-dimensional memory array structure. The three-dimensional memory array 200B may incorporate vertical structures which may include semiconductor pillars where a portion of a pillar may act as a channel region of the memory cells of strings 206. The strings 206 may be each selectively connected to a bit line $204_0$-$204_M$ by a select gate 212 and to the SRC 216 by a select gate 210. Multiple strings 206 can be selectively connected to the same bitline 204. Groups of strings 206 can be connected to their respective bitlines 204 by biasing the select lines $215_0$-$215_L$ to selectively activate particular select gates 212 each between a string 206 and a bitline 204. The select gates 210 can be activated by biasing the select line 214. Each wordline 202 may be connected to multiple rows of memory cells of the memory array 200B. Rows of memory cells that are commonly connected to each other by a particular wordline 202 may collectively be referred to as tiers.

FIG. 2C is a diagram of a portion of an array of memory cells 200C (e.g., a portion of the array of memory cells 104). Channel regions (e.g., semiconductor pillars) $238_{00}$ and $238_{01}$ represent the channel regions of different strings of series-connected memory cells (e.g., strings 206 of FIGS. 2A-2B) selectively connected to the bitline $204_0$. Similarly, channel regions $238_{10}$ and $238_{11}$ represent the channel regions of different strings of series-connected memory cells (e.g., NAND strings 206 of FIGS. 2A-2B) selectively connected to the bitline 204₁. A memory cell (not depicted in FIG. 2C) may be formed at each intersection of an wordline 202 and a channel region 238, and the memory cells corresponding to a single channel region 238 may collectively form a string of series-connected memory cells (e.g., a string 206 of FIGS. 2A-2B). Additional features might be common in such structures, such as dummy wordlines, segmented channel regions with interposed conductive regions, etc.

Figure 3:
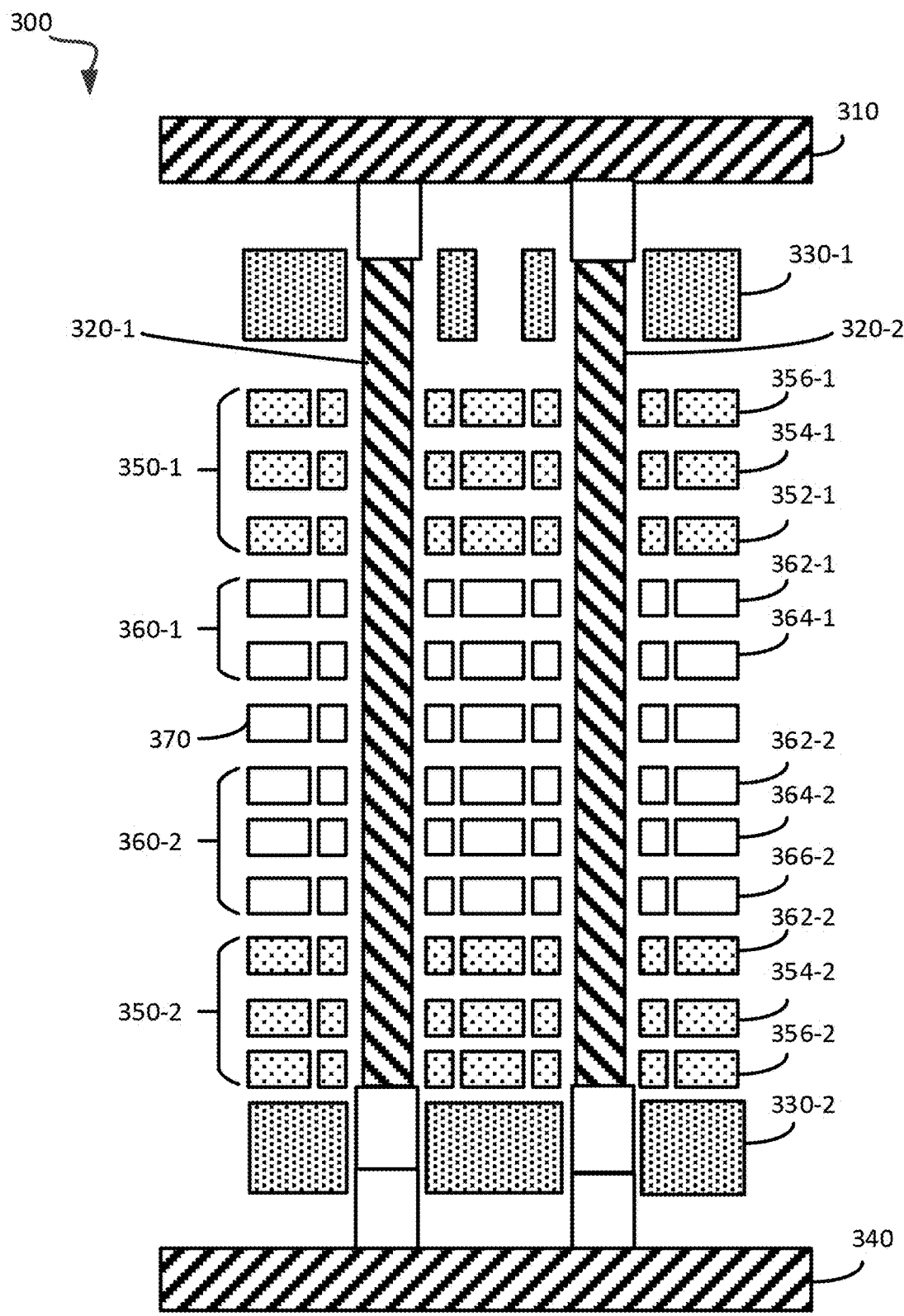
FIG. 3 is a diagram of an example three-dimensional (3D) replacement gate memory device that can enable performance of corrective reads implementing incremental reads, in accordance with some embodiments of the present disclosure.

FIG. 3 is a diagram of an example three-dimensional (3D) replacement gate memory device ("device") 300, in accordance with some embodiments of the present disclosure. However, the embodiments described herein can be applied to any suitable memory device. As shown, the device 300 includes a bitline 310, pillars 320-1 and 320-2, select gates (SGs) 330-1 and 330-2, a source line (SRC) 340, and WL groups 350-1, 350-2, 360-1 and 360-2. More specifically, WL groups 350-1 and 350-2 are dummy WL groups, and WL groups 360-1 and 360-2 are active WL groups. WL group 350-1 includes dummy WLs 352-1 through 366-1, WL group 650-2 includes dummy WLs 352-2 through 356-2, WL group 360-1 includes active WLs 362-1 and 364-1, and WL group 360-2 includes active WLs 362-2, 364-2 and 366-2. However, such an example should not be considered limiting. A dummy WL corresponds to memory cells that do not store data and are included to satisfy processing margins, while an active WL corresponds to memory cells that store data.

As further shown, a WL 370 is provided. In some embodiments, the device 300 is a multiple deck device, in which WL groups 350-1 and 360-1 are associated with a first deck (e.g., an upper deck) of the device 300 and the WL groups 350-2 and 360-2 are associated with a second deck (e.g., a lower deck) of the device 300, such that the WL 370 corresponds to a dummy WL separating the WL groups 360-1 and 360-2. In other embodiments, the device 300 is a "single deck" device, in which the WL groups 360-1 and 360-2 are not arranged in decks. Here, the WL 370 can be an active WL within one of the WL groups 360-1 or 360-2.

Figure 4:
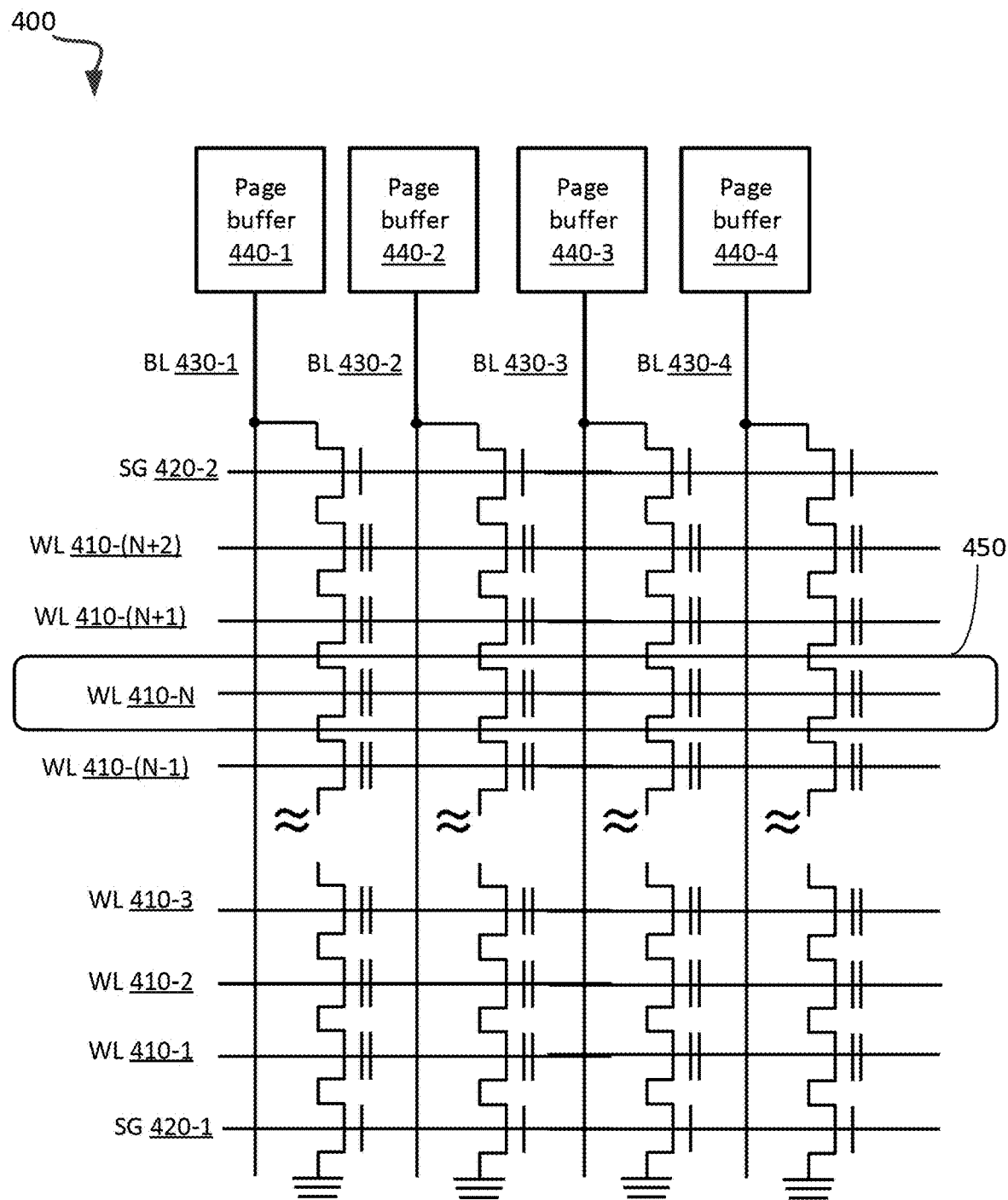
FIG. 4 is a diagram of a portion of a memory device, in accordance with some embodiments of the present disclosure.

FIG. 4 is a diagram of a portion of a memory array 400, in accordance with some embodiments. The memory array 400 can include any suitable number of wordlines (WLs). For example, as shown, the memory array 400 includes a number of wordlines WL 410-1 through WL 410-(N+2). Each of the WLs 410-1 through 410-(N+2) is connected to a respective set of cells. Each of the WLs 410-1 through 410-(N+2) is adjacent to at least one WL. For example, WL 410-(N+1) and WL 410-(N−1) are each adjacent wordlines with respect to WL 410-N. The memory array 400 further includes select gate (SG) 420-1 and SG 420-2 In some embodiments, SG 420-1 is a source-side SG (SGS) and SG 420-2 is a drain-side SG (SGD).

The memory array 400 further includes a number of bitlines (BLs) including BL 430-1 through 430-4 and a number of page buffers including page buffers 440-1 through 440-4. Each of the page buffers is connected to a respective one of the bitlines. Although only 4 bitlines 430-1 through 410-3 and page buffers 440-1 through 440-4 are shown, the memory array 400 can include any suitable number of bitlines and page buffers.

In this illustrative example, a set of target cells 450 is selected to be read. The set of target cells 450 includes a number of cells of the target wordline WL 410-N. Each target cell of the set of target cells 450 is adjacent to a pair of adjacent cells. More specifically, the pair of adjacent cells for a particular target cell includes the cell connected to WL 410-(N+1) that is directly above the target cell, and the cell connected to WL 410-(N−1) that is directly below the target cell. That is, a target cell of the set of target cells 450 is connected to a same one of the bitlines as its respective pair of adjacent cells.

A local media controller (e.g., local media controller 135 of FIGS. 1A-1B) can initiate a read operation with respect to the set of target cells 450. If the read operation fails, the local media controller can initiate a corrective read operation. During the corrective read operation, the local media controller can, for each target cell of the set of target cells 450, cause cell state information to be obtained for each cell of the respective group of adjacent cells. The cell state information for each cell can include a $V_T$ value indicative of the state of the cell (e.g., program state or erase state). For each cell of a group of adjacent cells, the cell state information can include a $V_T$ value indicative of a state of the cell.

In some embodiments, the cell state information for each group of adjacent cells is 1-bit information. For example, if each group of adjacent cells includes a single cell (e.g., a cell of WL 410-(N−1) or a cell of WL 410-(N+1)), then the cell state information for each group of adjacent cells can be 1-bit information obtained from the single cell. The local media controller can divide the set of target cells 450 into two bins. Each bin can be assigned target cells connected to an adjacent cell having 1-bit information determined to fall within a respective range of values. For example, assume that the 1-bit information for the single adjacent cell can fall into either a range A or a range B. Thus, each range defines a respective bin, namely bin A and bin B.

In some embodiments, the cell state information for each group of adjacent cells is 2-bit information. For example, if each group of adjacent cells includes a single cell (e.g., a cell of WL 410-(N−1) or a cell of WL 410-(N+1)), then the cell state information for each group of adjacent cells can be 2-bit information obtained from the single cell. The local media controller can divide the set of target cells 450 into four bins. Each bin can be assigned target cells connected to a group of adjacent cells having 2-bit information determined to fall within a respective range of values. For example, assume that the 2-bit information for a single cell can fall into range A, range B, range C or range D. Thus, each range defines a respective bin, namely bin A, bin B, bin C, bin D.

As another example, if each group of adjacent cells includes a pair of cells (e.g., a cell of WL 410-(N−1) and a cell of WL 410-(N+1)), then the cell state information for each group of adjacent cells can be 1-bit information obtained from each cell of the pair of cells. The local media controller can divide the set of target cells 450 into four bins. Each bin can be assigned target cells connected to a pair of adjacent cells having 2-bit information determined to fall within a respective combination of ranges of 1-bit information values. For example, assume that the 1-bit information for the cell of WL 410-(N−1) can fall into either a range A or a range B. Further assume that the 1-bit information for the cell of WL 410-(N+1) can fall into either a range 1 or a range 2. Thus, each combination of ranges defines a respective bin, namely bin A1, bin B1, bin A2, and bin B2.

In some embodiments, the cell state information for each group of adjacent cells is 4-bit information. For example, if each group of adjacent cells includes a pair of cells (e.g., a cell of WL 410-(N−1) or a cell of WL 410-(N+1)), then the cell state information for each group of cells can include 2-bit information obtained each cell of the pair of cells. The local media controller can divide the set of target cells 450 into sixteen bins. Each bin can be assigned target cells connected to a pair of adjacent cells having 4-bit information determined to fall within a respective combination of ranges of 2-bit information values. For example, assume that the 2-bit information for the cell of WL 410-(N−1) can fall into a range A, range B, range C or range D. Further assume that the 2-bit information for the cell of WL 410-(N+1) can fall into a range 1, a range 2, a range 3 or a range 4. Thus, each combination of ranges defines a respective bin, namely bin A1, bin B1, . . . , bin C4 and bin D4.

The local media controller can then initiate corrective read without read level offset calibration, or skip the corrective read without read level offset calibration in order to directly initiate auto-calibrated corrective read (ACCR). As described above with reference to FIG. 1A, during corrective read without read level offset calibration, each bin is associated with a previously defined read level offset that is used to read the target cells of the bin (e.g., fixed read level offset provided by a user to an auto-calibrated read level offset identified from a previous execution of ACCR). During ACCR, the local media controller identifies a set of auto-calibrated read levels. As described above with reference to FIG. 1A, each read level of the set of auto-calibrated read levels can be identified by performing read level offset calibration. The set of auto-calibrated read levels can then be used to read the set of target cells 450. If ACCR fails, then further error correction techniques can be performed in an attempt to address the read errors. Further details regarding performing a read operation implementing ACCR are described above with reference to FIG. 1A and will be described in further detail below with reference to FIGS. 5A-6B.

Figure 5:
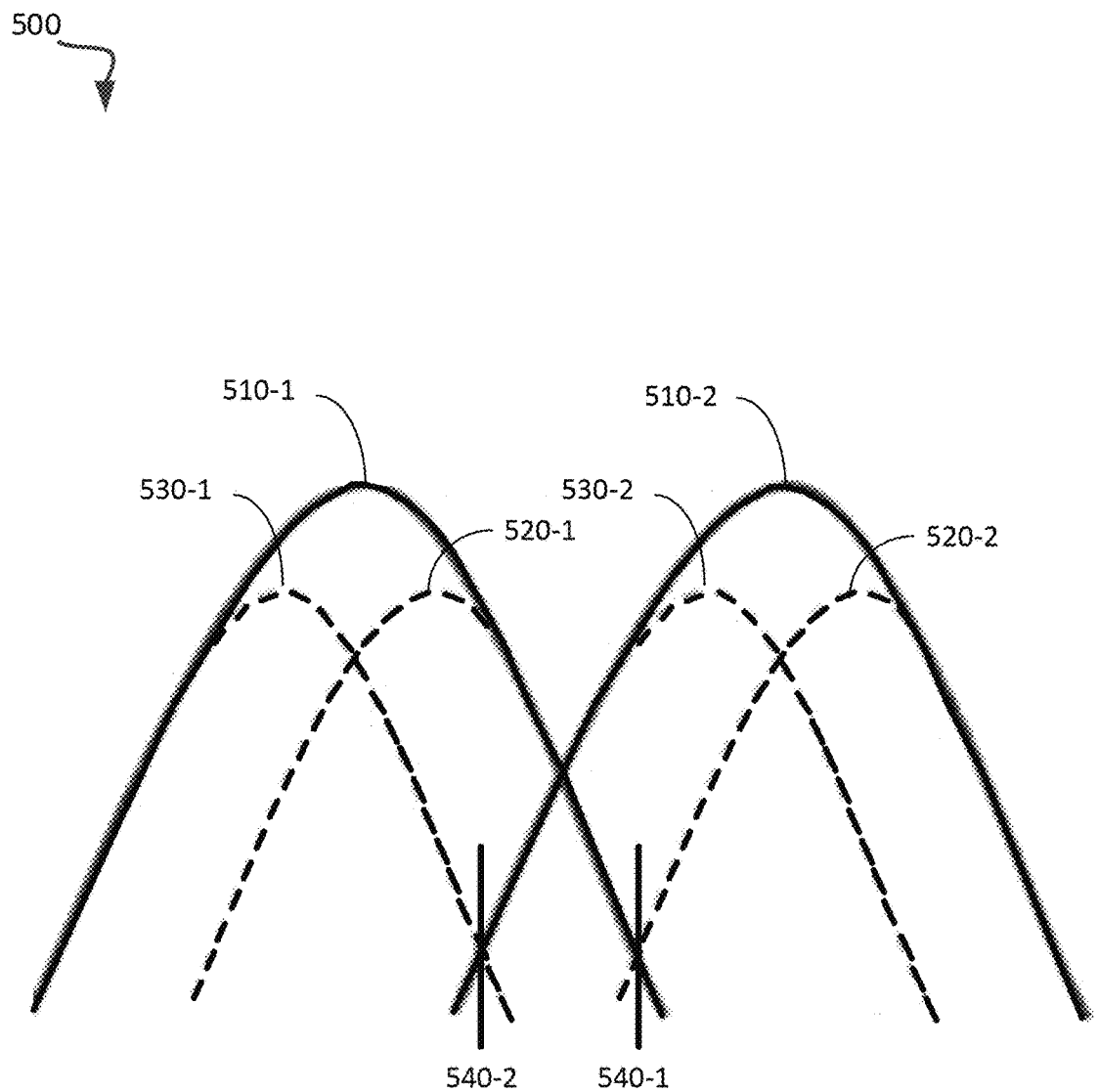
FIG. 5 is a diagram illustrating an example of auto-calibrated corrective read, in accordance with some embodiments of the present disclosure.

FIG. 5 is a diagram 500 illustrating an example implementation of auto-calibrated corrective read, in accordance with some embodiments of the present disclosure. The diagram 500 shows $V_T$ distributions ("distributions") 510-1 and 510-2. The distributions 510-1 and 510-2 can represent a portion of a total number of distributions of a set of target cells connected to a target wordline. For example, the distributions 510-1 and 510-2 can a portion of a total number of distributions of a set of TLC cells, in which there are eight total distributions and seven valleys. However, such an example should not be considered limiting.

As further shown, the diagram shows pairs of $V_T$ sub-distributions ("sub-distributions") 520-1 and 520-2, and 530-1 and 530-2. Pair of sub-distributions 520-1 and 520-2 can model the $V_T$ of target cells assigned to a first bin and pair of sub-distributions 530-1 and 530-2 can model the $V_T$ of target cells assigned to a second bin. For example, the first bin can be a programmed state bin in which each target cell neighbors a pair of adjacent cells including at least cell having a programmed state, and the second bin can be an erased state bin in which each target cell neighbors a pair of adjacent cells including both cells having an erased state. However, such an example should not be considered limiting.

Typically, the local media controller performs read calibration to locate the valley between the distributions 510-1 and 510-2, which serves as a "center read level". Corrective read can then be performed by applying respective predefined read level offsets with respect to the center read level for the target cells modeled by the pair of sub-distributions 520-1 and 520-2, and the pair of sub-distributions 530-1 and 530-2. For example, the predefined read level offsets can be fixed read level offsets received from a user. The predefined read level offsets can be different depending on, for example, cell-to-cell interference, data retention and cycling concerns. Furthermore, the fixed read level offsets provided by the user generally cater to worst case scenarios, and thus are not optimized for a particular set of sub-distributions.

To perform auto-calibrated corrective read as described herein, instead of using fixed read level offsets, the local media controller can identify a set of auto-calibrated read level offsets using read level offset calibration. More specifically, each auto-calibrated read level is located within a respective valley between a respective pair of sub-distributions. As shown in diagram 500, read level offset calibration identifies a read level offset 540-1 located within a valley between the sub-distributions 520-1 and 520-2. Additionally, read level offset calibration identifies a read level offset 540-2 located within a valley between the sub-distributions 530-1 and 530-2, which defines. The read level offset 540-1 can be applied to read the target cells assigned to the first bin, while the read level offset 540-2 can be applied to read the target cells assigned to the second bin. By identifying auto-calibrated read level offsets, the local media controller can obtain optimized read level offsets to more accurately read the target cells with reduced chance of read errors. Accordingly, performing read calibration with respect to sub-distributions during auto-calibrated corrective read can lead to improved memory device performance.

Figure 6A:
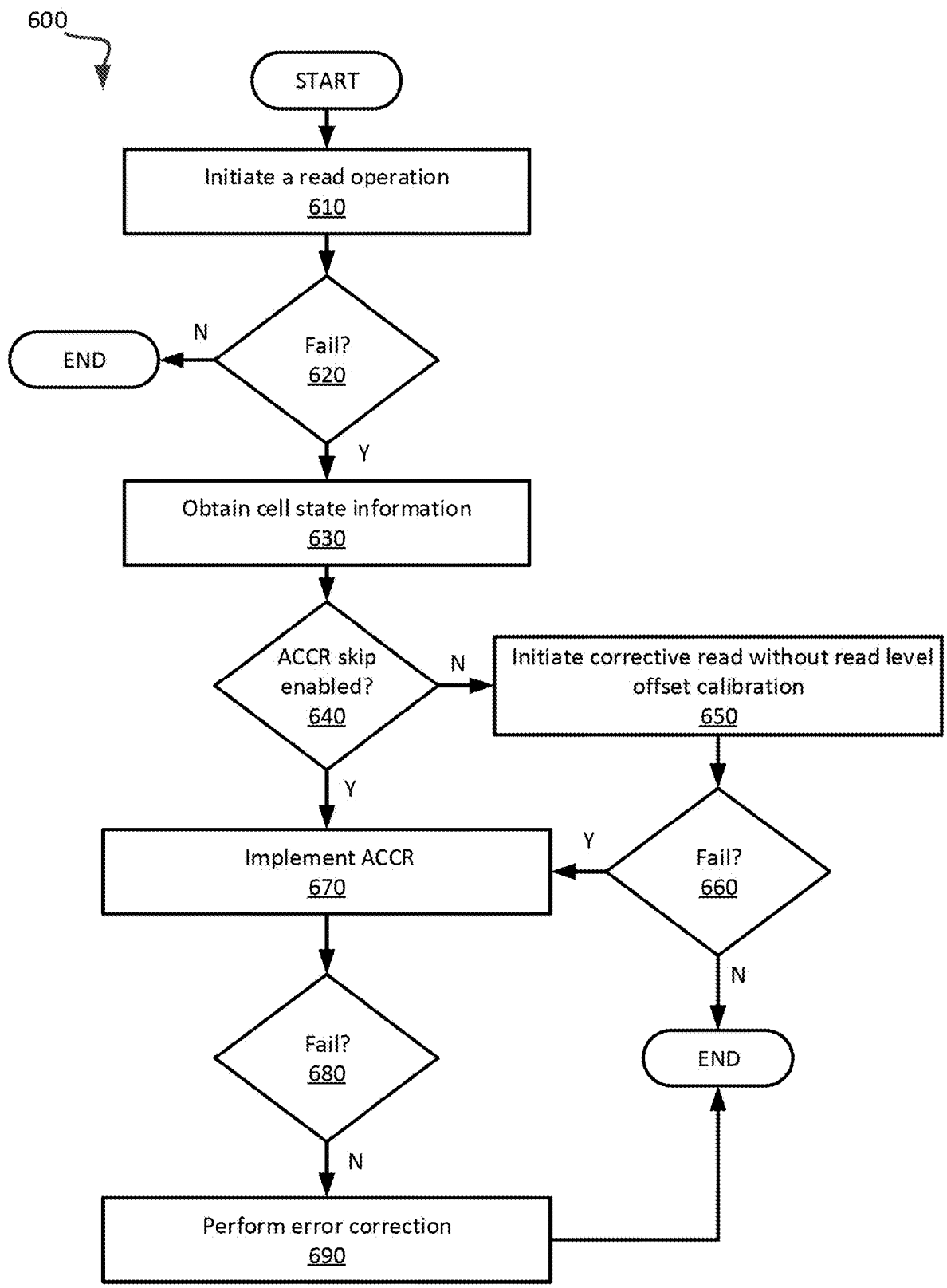
FIG. 6A is a flow diagram of example method to read a set of target cells, in accordance with some embodiments of the present disclosure.

FIG. 6A is a flow diagram of an example method 600 to read a set of target cells, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the CR component 137 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, a read operation is initiated. For example, processing logic can initiate the read operation with respect to a set of target cells connected to a target wordline. Each target cell of the set of target cells can be connected to a respective bitline. Each target cell can be connected to a respective pair of adjacent cells by its bitline. For example, in a memory array of a 3D memory device, one cell of the pair of adjacent cells is located directly above the target cell, and the other cell of the pair of adjacent cells is located directly below the target cell.

To perform the non-corrective read, the processing logic can utilize a read level offset derived from the set of target cells. For example, the read level offset can be located in a valley between a pair of $V_T$ distributions. The read level offset can be located by performing read level offset calibration with respect to the pair of $V_T$ distributions, as described above.

At operation 620, it is determined whether the non-corrective read has failed. For example, the processing logic can determine whether the non-corrective read has failed. If the processing logic determines that the non-corrective read has succeeded, then the read is complete and the process ends.

If the non-corrective read has failed, then at operation 630, cell state information is obtained. For example, the processing logic can cause the cell state information to be obtained for each pair of adjacent cells. In some embodiments, the processing logic can obtain the cell state information by, for each pair of adjacent cells, reading the cells of the pair of adjacent cells to generate the cell state information, and storing the cell state information in a respective page buffer. Each page buffer is connected to a pair of adjacent cells via a respective bitline.

In some embodiments, the cell state information includes 1-bit information. For example, 1-bit information can be indicative of at least one adjacent cell of the pair of adjacent cells having a programmed state (e.g., logical "0"). As another example, the 1-bit information can be indicative of both cells of the pair having an erased state (e.g., logical "1").

In some embodiments, the cell state information includes 2-bit information. For example, the 2-bit information can be indicative of both of the adjacent cells having a programmed state (e.g., logical "00"). As another example, the 2-bit information can be indicative of one of the adjacent cells having a programmed state and the other of the adjacent cells having an erased state (e.g., logical "01" or "10"). As yet another example, the 2-bit information for a pair of adjacent cells can be indicative of both cells of the pair having an erased state (e.g., logical "00").

At operation 640, it is determined whether auto-calibrated corrective read (ACCR) skip is enabled. For example, the processing logic can determine whether ACCR skip is enabled. In some embodiments, determining whether ACCR skip is enabled includes determining whether an ACCR skip bit is set (e.g., ACCR skip is enabled if the ACCR skip bit is set).

If the processing logic determines that ACCR skip is disabled, this means that the processing logic will attempt to perform corrective read without read level offset calibration read level offset calibration.

During corrective read without read level offset calibration, the processing device can, using the cell state information, divide the set of target cells into respective state information bins ("bins"). Each bin includes target cells that are adjacent to a pair of adjacent cells determined to have a same state based on the cell state information. Dividing the set of target cells into respective bins of target cells can include assigning each target cell of the set of target cells to a respective bin.

For example, in the 1-bit information embodiments, a target cell can be assigned to a programmed state bin if the target cell is connected to a page buffer storing 1-bit information indicating that the target cell is adjacent to a pair of adjacent cells in which at least one cell has a programmed state (e.g., logical "0"). In contrast, a target cell can be assigned to an erased state bin if the target cell is connected to a page buffer storing 1-bit information indicating that the target cell is adjacent to a pair of adjacent cells in which both adjacent cells have an erased state (e.g., logical "1").

As another example, in the 2-bit information embodiments, a target cell can be assigned to a programmed state bin if the target cell is connected to page buffer storing 2-bit information indicating that the target cell neighbors a pair of adjacent cells in which both adjacent cells have a programmed state (e.g., logical "00"). A target cell can be assigned to a non-erased state bin if the target cell is connected to a page buffer storing 2-bit information indicating that the target cell neighbors a pair of adjacent cells in which one adjacent cell has a programmed state and the other adjacent cell has an erased state (e.g., logical "01" or "10"). A target cell can be assigned to an erased state bin if the target cell is connected to a page buffer storing 2-bit information indicating that the target cell neighbors a pair of adjacent cells in which both adjacent cells have an erased state (e.g., logical "11").

During corrective read without read level offset calibration, each bin is associated with a previously defined read level offset that is used to read the target cells of the bin. In some embodiments, each previously defined read level offset is a predefined read level offsets. For example, each predefined read level offsets can be a fixed read level offset provided by a user. In some embodiments, each previously defined read level offset is an auto-calibrated read level offset identified from a previous execution of ACCR. The previously defined read level offsets collectively form a set of previously defined read level offsets.

The target cells of each bin can then be read with a respective previously defined read level offset of the set of previously defined read level offsets. At operation 660, it is determined whether the corrective read without read level offset calibration has failed. For example, the processing logic can determine whether performing the read operation with the set of previously defined read level offsets has failed. If the corrective read without read level offset calibration has succeeded, this means that the read is complete, and the process ends.

If the corrective read without read level offset calibration is determined to have failed at operation 660, or if ACCR skip is determined to be enabled at operation 640, ACCR can be implemented at operation 670. For example, the processing logic can initiate ACCR. During ACCR, similar to corrective read without read level offset calibration, the processing device can, using the cell state information, divide the set of target cells into respective bins. In contrast to corrective read without read level offset calibration, during ACCR, each bin is associated with an auto-calibrated read level offset that is used to read the target cells of the bin. The auto-calibrated read level offsets collectively form a set of auto-calibrated read level offsets. Further details regarding performing ACCR will be described below with reference to FIG. 6B.

At operation 680, it is determined whether ACCR has failed. For example, the processing logic can determine whether performing ACCR with the set of auto-calibrated read level offsets has failed. If ACCR has succeeded, this means that the read is complete, and the process ends. If ACCR has failed, this means that ACCR has resulted in a number of read errors. Error correction can be performed at operation 690. For example, the processing logic can perform one or more error correction techniques to address read errors. Further details regarding operations 610-690 are described above with reference to FIGS. 1A, 4 and 5 and will be described below with reference to FIG. 6B.

Figure 6B:
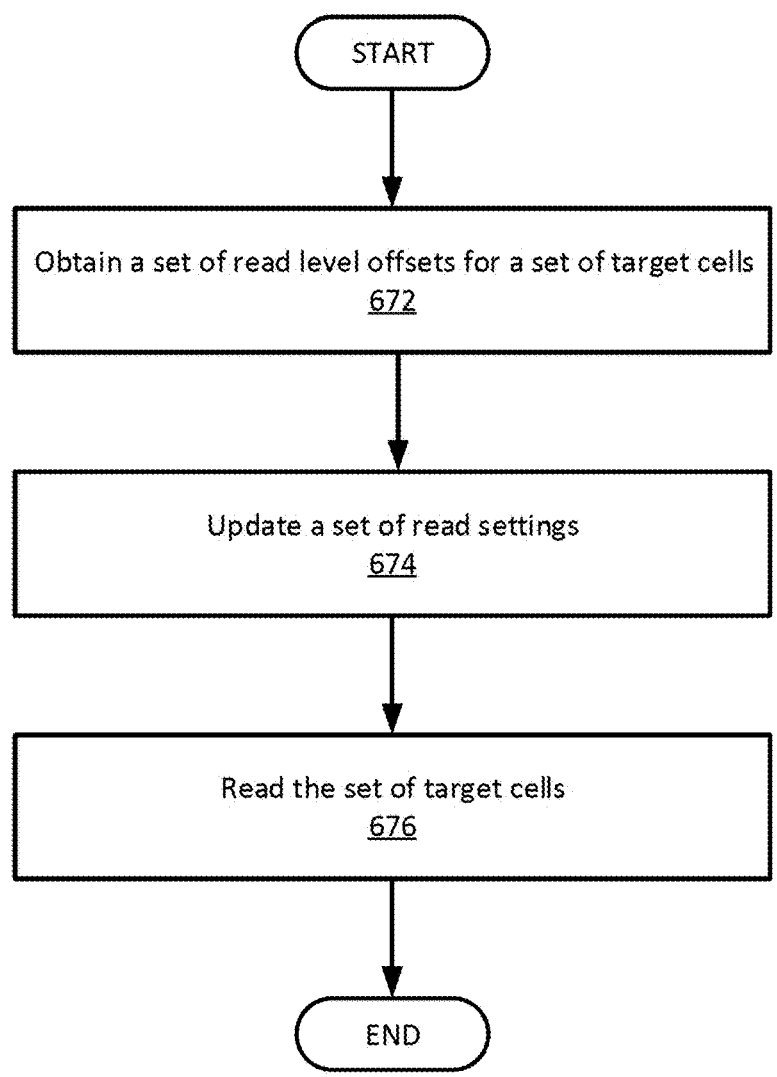
FIG. 6B is a flow diagram of example method to perform auto-calibrated corrective read, in accordance with some embodiments of the present disclosure.

FIG. 6B is a flow diagram of an example method 670 to perform auto-calibrated corrective read, in accordance with some embodiments of the present disclosure. The method 670 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 670 is performed by the CR component 137 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 672, a set of auto-calibrated read level offsets is obtained. For example, the processing logic can cause, for each bin of target cells, an auto-calibrated read level offset to be obtained. In some embodiments, obtaining the set of auto-calibrated read level offsets comprises performing read level offset calibration to determine each auto-calibrated read level offset. For example, the target cells of each bin can define a pair of $V_T$ sub-distributions of target cells, where each pair of $V_T$ sub-distributions of target cells models the $V_T$ distribution for the target cells of the bin. Each auto-calibrated read level offset of the set of read level offsets can be located within a valley between a respective pair of $V_T$ sub-distributions by separately analyzing the pair of $V_T$ sub-distributions using read level offset calibration. For example, in the 1-bit information embodiments, a pair of $V_T$ sub-distributions can model the target cells assigned to the programmed state bin. Another pair of $V_T$ sub-distributions can model the target cells assigned to the erased state bin.

At operation 674, a set of read settings is updated. For example, the processing logic can update the set of read settings to include the set of auto-calibrated read level offsets. In some embodiments, the set of auto-calibrated read level offsets replaces (e.g., overwrites) the previous set of read level offsets.

At operation 676, the set of target cells is read. For example, the processing logic can cause the set of target cells to be read using the set of read settings. Each target cell of the set of target cells can be read using a respective auto-calibrated read level offset of the set of auto-calibrated read level offsets. Since the read level offsets used to read each group of target cells are calibrated on-the-fly, the read operation performed using the set of auto-calibrated read level offsets can lead to reduced error rates and improved memory device performance. Further details regarding operations 672-676 are described above with reference to FIGS. 1A, 4 and 5.

Figure 7:
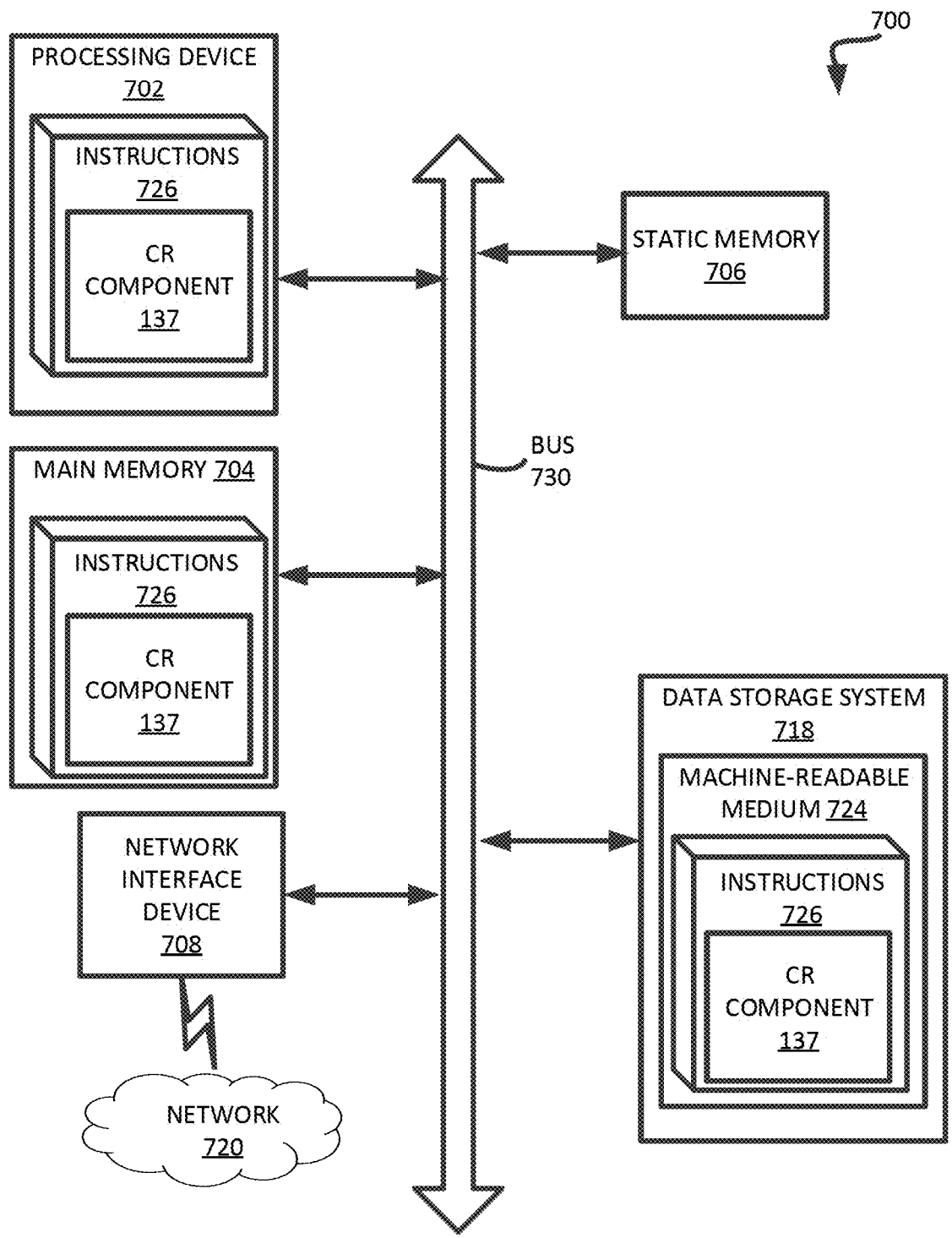
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the CR component 137 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 602 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1A.

In one embodiment, the instructions 726 include instructions to implement functionality corresponding to a CR component (e.g., the CR component 137 of FIG. 1A). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array comprising:
   a set of target cells connected to a target wordline;
   at least one wordline adjacent to the target wordline; and
   for each target cell of the set of target cells, a respective group of adjacent cells adjacent to the target cell, wherein each group of adjacent cells comprises at least one cell connected to the at least one wordline; and
   control logic, operatively coupled with the memory array, to perform operations comprising:
   causing a read operation to be initiated with respect to the set of target cells;
   determining whether the read operation has failed;
   in response to determining that the read operation has failed, obtaining, for each group of adjacent cells, respective cell state information;
   assigning, based on the cell state information, each target cell of the set of target cells to a respective state information bin of a set of state information bins;
   determining whether to initiate auto-calibrated corrective read;
   in response to determining to initiate auto-calibrated corrective read, performing read level offset calibration to determine a set of calibrated read level offsets, wherein each calibrated read level offset of the set of calibrated read level offsets is associated with a respective state information bin of the set of state information bins; and
   causing the set of target cells to be read using the set of calibrated read level offsets.

2. The memory device of claim 1, wherein:
   the set of target cells is associated with a threshold voltage distribution; and
   each state information bin of the set of state information bins is associated with a threshold voltage sub-distribution of target cells assigned to the state information bin.

3. The memory device of claim 2, wherein performing read level offset calibration to determine the set of calibrated read level offsets comprises locating each calibrated read level offset of the set of calibrated read level offsets in a valley between a respective pair of threshold voltage sub-distributions.

4. The memory device of claim 1, wherein determining whether to initiate auto-calibrated corrective read comprises determining whether an auto-calibrated corrective read skip bit is set.

5. The memory device of claim 4, wherein the operations further comprise, in response to determining that auto-calibrated corrective read skip bit is set, initiating the auto-calibrated corrective read.

6. The memory device of claim 1, wherein the operations further comprise:
   in response to determining to not initiate auto-calibrated corrective read, performing a corrective read without read level offset calibration by causing each target cell of the set of target cells to be read using a respective predefined read level offset of a set of predefined read level offsets, wherein each predefined read level offset of the set of predefined read level offsets is associated with a respective state information bin of the set of state information bins;
   determining whether the corrective read without read level offset calibration has failed; and
   in response to determining that the corrective read without read level offset calibration has failed, initiating the auto-calibrated corrective read.

7. The memory device of claim 1, wherein the operations further comprise, prior to causing the set of target cells to be read using the set of calibrated read level offsets, updating a previous set of read level offsets with the set of calibrated read level offsets.

8. A method comprising:
   causing, by a processing device, a read operation to be initiated with respect to a set of target cells connected to a target wordline of a memory device, wherein the target wordline is adjacent to a first wordline and a second wordline, wherein, for each target cell of the set of target cells, a respective pair of adjacent cells is adjacent to the target cell, and wherein each pair of adjacent cells comprises a first cell connected to the first wordline and a second cell connected to the second wordline;
   determining, by the processing device, whether the read operation has failed;
   in response to determining that the read operation has failed, obtaining, by the processing device for each group of adjacent cells, respective cell state information;
   assigning, by the processing device based on the cell state information, each target cell of the set of target cells to a respective state information bin of a set of state information bins;
   determining, by the processing device, whether to initiate auto-calibrated corrective read;
   in response to determining to initiate auto-calibrated corrective read, performing, by the processing device, read level offset calibration to determine a set of calibrated read level offsets, wherein each calibrated read level offset of the set of calibrated read level offsets is associated with a respective state information bin of the set of state information bins; and
   causing, by the processing device, the set of target cells to be read using the set of calibrated read level offsets.

9. The method of claim 8, wherein:
   the set of target cells is associated with a threshold voltage distribution; and
   each state information bin of the set of state information bins is associated with a threshold voltage sub-distribution of target cells assigned to the state information bin.

10. The method of claim 9, wherein performing read level offset calibration to determine the set of calibrated read level offsets comprises locating each calibrated read level offset of the set of calibrated read level offsets in a valley between a respective pair of threshold voltage sub-distributions.

11. The method of claim 8, wherein determining whether to initiate auto-calibrated corrective read comprises determining whether an auto-calibrated corrective read skip bit is set.

12. The method of claim 11, further comprising, in response to determining that auto-calibrated corrective read skip bit is set, initiating, by the processing device, the auto-calibrated corrective read.

13. The method of claim 8, further comprising:
   in response to determining to not initiate auto-calibrated corrective read, performing, by the processing device, a corrective read without read level offset calibration by causing each target cell of the set of target cells to be read using a respective predefined read level offset of a set of predefined read level offsets, wherein each predefined read level offset of the set of predefined read level offsets is associated with a respective state information bin of the set of state information bins;
   determining, by the processing device, whether the corrective read without read level offset calibration has failed; and
   in response to determining that the corrective read without read level offset calibration has failed, initiating the auto-calibrated corrective read.

14. The method of claim 8, further comprising, prior to causing the set of target cells to be read using the set of calibrated read level offsets, updating, by the processing device, a previous set of read level offsets with the set of calibrated read level offsets.

15. A non-transitory computer-readable storage medium comprising instructions that, when executed by a processing device, cause the processing device to perform operations comprising:
   obtaining, for each group of adjacent cells of a memory device, respective cell state information, wherein each group of adjacent cells comprises at least one cell adjacent to a target cell of a set of target cells connected to a target wordline, and wherein the at least one cell is connected to an adjacent wordline adjacent to the target wordline;
   assigning, based on the cell state information, each target cell of the set of target cells to a respective state information bin of a set of state information bins;
   determining whether to initiate corrective read without read level offset calibration;
   in response to determining to initiate corrective read without read level offset calibration, performing a corrective read without read level offset calibration by causing each target cell of the set of target cells to be read using a respective predefined read level offset of a set of predefined read level offsets, wherein each predefined read level offset of the set of predefined read level offsets is associated with a respective state information bin of the set of state information bins;
   determining whether the corrective read without read level offset calibration has failed; and
   in response to determining that the corrective read without read level offset calibration has failed, performing read level offset calibration to determine a set of calibrated read level offsets, wherein each calibrated read level offset of the set of calibrated read level offsets is associated with a respective state information bin of the set of state information bins.

16. The non-transitory computer-readable storage medium of claim 15, wherein:
   the set of target cells is associated with a threshold voltage distribution; and
   each state information bin of the set of state information bins is associated with a threshold voltage sub-distribution of target cells assigned to the state information bin.

17. The non-transitory computer-readable storage medium of claim 16, wherein performing read level offset calibration to determine the set of calibrated read level offsets comprises locating each calibrated read level offset of the set of calibrated read level offsets in a valley between a respective pair of threshold voltage sub-distribution.

18. The non-transitory computer-readable storage medium of claim 15, wherein the operations further comprise, in response to determining to not initiate corrective read without read level offset calibration, performing read level offset calibration to determine the set of calibrated read level offsets.

19. The non-transitory computer-readable storage medium of claim 15, wherein the operations further comprise:
- causing a read operation to be initiated with respect to the set of target cells;
- determining whether the read operation has failed; and
- in response to determining whether the read operation has failed, determining whether to initiate corrective read without read level offset calibration.

20. The non-transitory computer-readable storage medium of claim 15, wherein the operations further comprise:
- updating the set of predefined read level offsets with the set of calibrated read level offsets; and
- causing the set of target cells to be read using the set of calibrated read level offsets.

* * * * *